United States Patent [19]

Chalmers et al.

[11] Patent Number: 5,379,719
[45] Date of Patent: Jan. 10, 1995

[54] METHOD OF DEPOSITION BY MOLECULAR BEAM EPITAXY

[75] Inventors: Scott A. Chalmers; Kevin P. Killeen; Kevin L. Lear, all of Albuquerque, N. Mex.

[73] Assignee: Sandia National Laboratories, Albuquerque, N. Mex.

[21] Appl. No.: 97,500

[22] Filed: Jul. 26, 1993

[51] Int. Cl.$^6$ ............................................. C30B 25/02
[52] U.S. Cl. ..................................... 117/89; 437/105; 437/107; 437/126; 437/133
[58] Field of Search ............... 156/613; 437/105, 107, 437/126, 133; 117/89

[56] References Cited

U.S. PATENT DOCUMENTS

| | | | |
|---|---|---|---|
| 4,914,488 | 4/1990 | Yamane et al. | 357/4 |
| 4,944,246 | 7/1990 | Tanaka et al. | 156/613 |
| 4,975,252 | 12/1990 | Nishizawa et al. | 118/715 |
| 5,094,974 | 3/1992 | Grunthaner et al. | 437/107 |
| 5,096,533 | 3/1992 | Igarashi | 437/105 |
| 5,143,856 | 9/1992 | Iwasaki | 437/107 |
| 5,147,461 | 9/1992 | Igarashi | 118/715 |
| 5,170,407 | 12/1992 | Schubert et al. | 372/45 |

OTHER PUBLICATIONS

Hong, M. et al., "A simple way to reduce series resistance in p-doped semiconductor distributed Bragg reflectors," Journal of Crystal Growth, 111 (1991) pp. 1071–1075.

*Primary Examiner*—R. Bruce Breneman
*Assistant Examiner*—Ramamohan Rao Paladugu
*Attorney, Agent, or Firm*—Timothy D. Stanley; George H. Libman

[57] ABSTRACT

A method is described for reproducibly controlling layer thickness and varying layer composition in an MBE deposition process. In particular, the present invention includes epitaxially depositing a plurality of layers of material on a substrate with a plurality of growth cycles whereby the average of the instantaneous growth rates for each growth cycle and from one growth cycle to the next remains substantially constant as a function of time.

21 Claims, 7 Drawing Sheets

METHOD OF DEPOSITION BY MOLECULAR BEAM EPITAXY

The United States Government has rights in this invention pursuant to Contract No. DE-AC04-76DP00789 between the Department of Energy and American Telephone and Telegraph Company.

BACKGROUND OF THE INVENTION

The present invention relates generally to methods for epitaxially depositing a layer of material on a substrate and, more particularly, to an improved method of molecular beam epitaxial (MBE) deposition for reproducibly controlling layer thickness and varying layer composition.

A variety of MBE methods and apparatus have been developed for depositing thin layers of material on substrates. The MBE process is an ultra-high vacuum (e.g. $10^{-11}$ Torr) process whereby group III elements (e.g. Ca, Al, In) and group V elements (e.g. As, P) are heated to form molecular or atomic beams which can than be epitaxially deposited onto a heated substrate as generally described by Tanaka et al in U.S. Pat. No. 4,944,246. Additionally, dopant material (e.g. Be, Cr) can be also deposited.

More recently, the MBE process has been adapted to produce devices having a plurality of controlled layer thicknesses and alternating compositions, e.g. distributed Bragg reflectors (DBR). DBRs are composed of alternating quarter-wavelength ($\lambda/4$) layers of high and low refractive index materials (e.g. GaAs and AlAs). Generally, controlling layer thickness and composition in the MBE process has involved initially calibrating the MBE system and defining a layer growth rate. Thereafter by simply timing the growth period desired layer thicknesses can be achieved, assuming the growth rate remained substantially constant. However, MBE system operating parameters can vary during a growth cycle as well as from one growth cycle to the next resulting in growth rates which can increase or decrease as a function of time. In particular, changes in source cell temperatures can severely alter the desired growth rate. In fact, when changing source cell temperatures in present MBE systems, the growth rate must be recalibrated after the molecular beam stabilizes, thus a considerable period of time can be lost before the desired growth rate has been reestablished.

An improved MBE method for controlling layer thickness and varying layer composition is described by Igarashi in U.S. Pat. No. 5,096,533 whereby source cell temperature and growth rate can be more accurately controlled. However, layer thickness and composition are controlled by physically interposing a shutter between the source cell and the substrate and opening/closing the shutter to control layer thickness and composition. In such fashion, source cell temperatures can be thus kept at a relatively constant value and thus avoid up and down swings in growth rates resulting from varying source cell temperatures. However, the shuttered MBE source cell operation is still dependent on the assumption of a fixed growth rate so that layer composition and thickness can be controlled simply by controlling the period of deposition.

More recently, Hong et al in, "A simple way to reduce series resistance in p-doped semiconductors and distributed Bragg reflectors", *Journal of Crystal Growth*, 111 (1991) 1071-1075 described an improved MBE system which eliminates the need for shutters to control layer thickness and vary composition. Rather than physically shutter the atomic or molecular beam of each source cell, Hong simply varies the source cell operating temperature thus effectively controlling the intensity of the molecular beam between a maximum and a minimum. Much like prior MBE systems though, Hong still depends upon keeping growth rates essentially constant. Quite simply, while Hong teaches using a plurality of MBE growth cycles to achieve a plurality of layers of alternating composition, he still depends upon maintaining a constant growth rate during the manufacture of a single DBR.

In spite of such advances, MBE processes persist to operate under the assumption that constant growth rate will yield controlled layer thicknesses and compositions. The essence of such assumption is that variations in growth rate during the MBE process cannot be tolerated. Consequently, a need remains for an MBE process which can reliably reproduce specified layer thicknesses and for controlling layer compositions without depending on the assumption of constant growth rate and the resulting need to recalibrate growth rates periodically. Moreover, a need exists to reliably produce a plurality of devices with the MBE process. This need has most recently arisen in the field of DBRs for vertical-cavity surface-emitting lasers (VCSELs) which can require center reflection wavelengths with a tolerance of at least $\pm 1-2\%$. Additionally, a need has arisen for an MBE process to produce DBRs having reduced heterojunction resistance.

SUMMARY OF THE INVENTION

The present invention relates generally to a method for reproducibly depositing thin layers of material on a substrate of a given thickness and for controlling layer composition. The present invention includes an improved MBE process whereby source cell temperatures are controlled so as to vary generally between a maximum and minimum temperature so as to yield a plurality of instantaneous growth rates and growth cycles; however, the variations in instantaneous growth rate from one growth cycle to the next are controlled so that the average of the instantaneous growth rates remains generally constant during each growth cycle and from one growth cycle to the next. In particular, a novel MBE process is described for producing DBRs having closely controlled reflective properties as well as lower heterojunction resistance. The source cell temperatures of an MBE system are varied so as to produce at least two, piece-wise linearly graduated interfaces between alternating layers of the DBR.

DETAILED DESCRIPTION OF THE INVENTION

In order to better understand the present invention, the following introductory discussion is provided. Molecular beam epitaxial (MBE) deposition comprises an ultra-high vacuum method of depositing thin layers of material on a substrate. MBE deposition processes typically involve the formation of an atomic or molecular beam of at least one material and the epitaxial deposition of such material onto a substrate. Layers of material having controlled thicknesses and varying compositions can be produced with conventional MBE process by accurately initially determining, and thereafter strictly constraining, layer growth rates to a constant, fixed value. However, because of the variation of MBE process parameters which can effect growth rate, growth rates, and hence layer thickness and composition, cannot be reproducibly controlled so as to reliably replicate layers of material having substantially the same thicknesses and compositions from one growth cycle to the next and from one device to the next.

Figure 1:
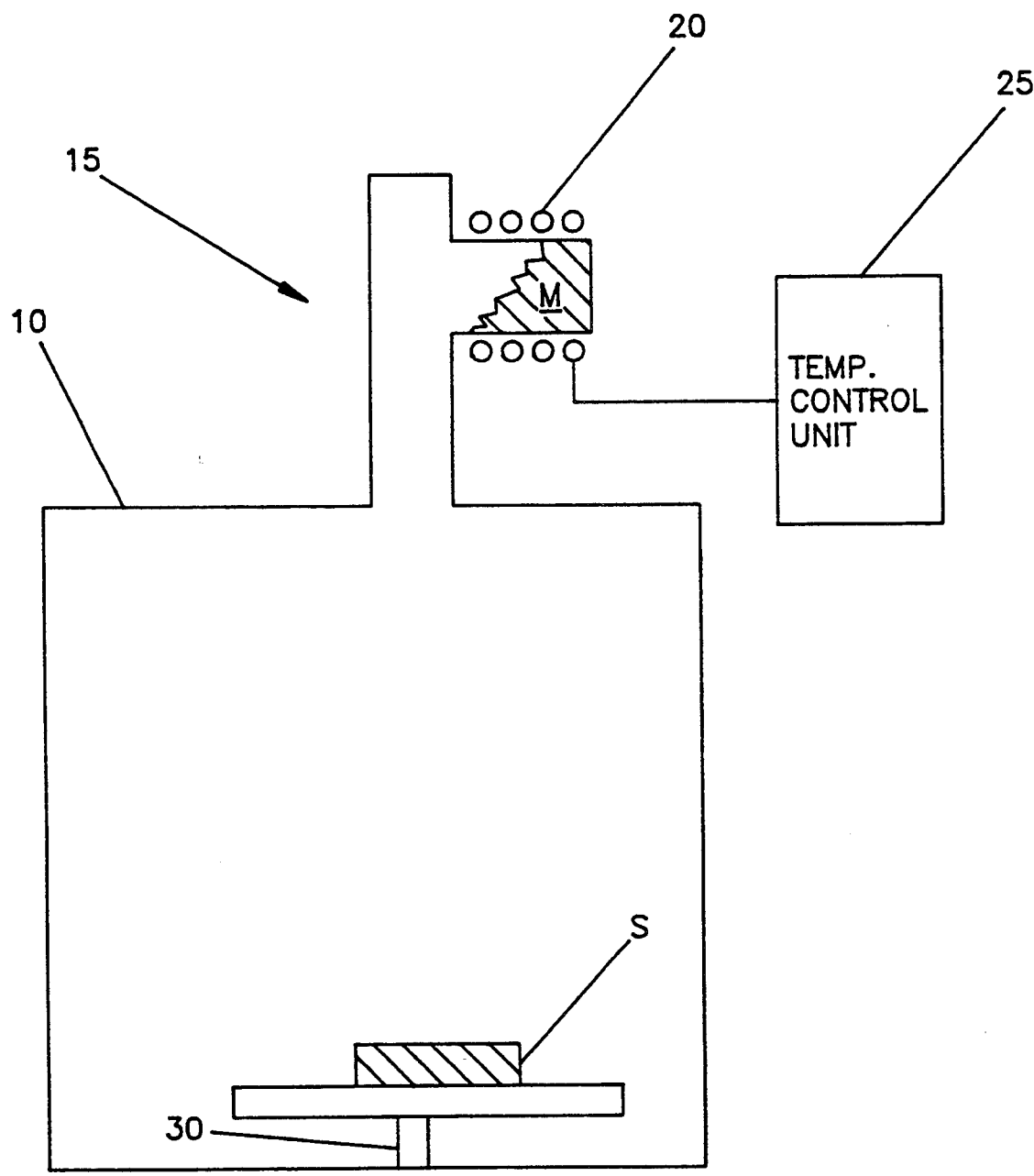
FIG. 1 is a schematic representation of a MBE system according to the present invention.

The MBE system of the present invention is schematically depicted in FIG. 1 and comprises: a vacuum chamber 10; at least one molecular beam source cell 15 having a heating unit 20 for heating a source material M within the source cell so as to form a molecular or atomic beam; a source cell temperature control unit 25 for controlling the source cell temperature; and a substrate holder 30 for holding a substrate S on which it is desired to epitaxially deposit thin layers of the material M thereon.

Figure 2:
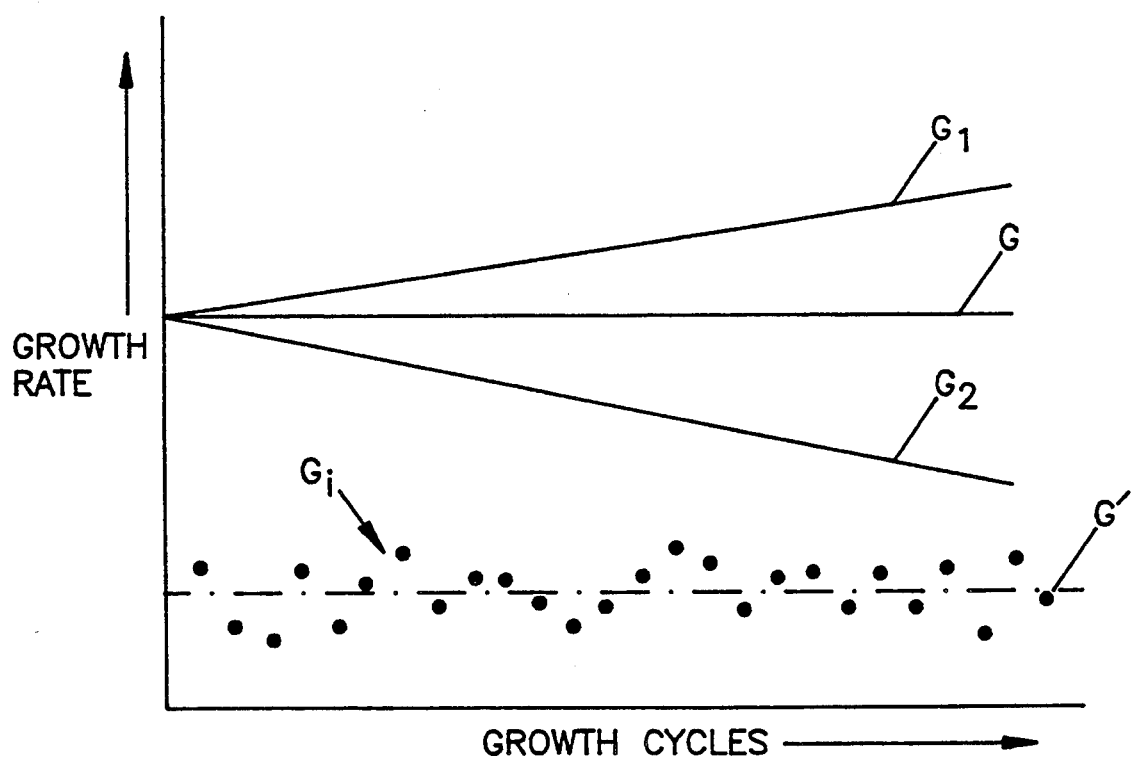
FIG. 2 depicts MBE growth rates as a function of the number of growth cycles.

Unlike typical MBE deposition processes which attempt to maintain a constant or fixed growth rate G, as depicted in FIG. 2, for each growth cycle as well as from one growth cycle to the next, the present invention employs a plurality of growth cycles and instantaneous growth rates $G_i$. Moreover, the present invention does not attempt to maintain a substantially fixed or constant growth rate for each growth cycle. But rather, the instantaneous growth rates $G_i$ can vary randomly from one growth cycle to the next, provided the average of the instantaneous growth rates $G'$ over each growth cycle and from growth cycle to growth cycle remains substantially unchanged as a function of time. That is, while the maximum in the instantaneous growth rates $G_i$ in each growth cycle, depicted as dots in FIG. 2, can be seen to vary from one growth cycle to the next, the average of the instantaneous growth rates $G'$ remains substantially unchanged as a function of the number of growth cycles and hence time. Such approach can result in more reliable layer thicknesses and allows varying layer compositions and, as will be discussed below, more reproducible center reflection wavelengths for DBRs. However, to ensure that the average of the instantaneous growth rates $G'$ remains substantially unchanged as a function of time, as opposed to growth rates $G_1$ and $G_2$ depicted in FIG. 2, a temperature control system for more reproducibly controlling source cell temperatures is employed. In fact, growth rates $G_1$ and $G_2$ show the more typical variation in growth rates as a function of time for conventional MBE processes in spite of efforts to maintain a constant growth rate. This is so because growth rates are only calculated before the onset of actual layer deposition and are merely assumed to be constant as a function of time thereafter even though a variety of MBE process parameters can vary over the course of layer depositions resulting in growth rates (e.g. $G_1$ and $G_2$) which can vary by as much as 1-2% provided no changes have been made to source cell temperatures and by as much as 5-10% if source cell temperatures are varied without recalibration of the growth rates. Such limitations have greatly impeded commercial manufacture of a plurality of devices, each within a specified tolerance, such as DBRs which can require center reflection wavelengths with tolerances of at least ±1-2%.

Growth rates for a source cell can vary over both the long term and the short term. Long term variations in growth rate occur over weeks and months and are generally considered to be caused by redistribution and depletion of the source material in the source cell. Short term variations in growth rate occur each time a source cell temperature is changed and are likely caused by shifts in thermocouple positioning brought about by thermal expansion and contraction resulting from variations in source cell temperature. Without recalibration, short term variations in growth rate can lead to uncertainties of a few per cent.

It has been discovered that if the short term variations in growth rate can be controlled to vary, about a stable average over time, such variations can be averaged out. For example, a typical DBR consists of 40 individual $\lambda/4$ layers of alternating materials. While present MBE processes for fabricating DBRs have focused on strictly controlling each $\lambda/4$ layer thickness and composition, the center reflection wavelength of such DBRs is determined only by the average of the layer thicknesses rather than by any requirement that each layer be precisely $\lambda/4$. Moreover, the heterojunction resistance of such DBRs can be greatly reduced if composition of adjacent layers makes a gradual change from one layer composition to the other layer composition rather than abruptly change at the interface of adjacent layers. Thus while individual layer thicknesses in the DBR may vary by a few percent, the DBR's center reflection wavelength is determined by the stable average growth for the total process. This discovery makes production of DBR's with accurate and reproducible center reflection wavelengths possible without the need to either initially calibrate or interrupt the process and recalibrate growth rates.

Figure 3:
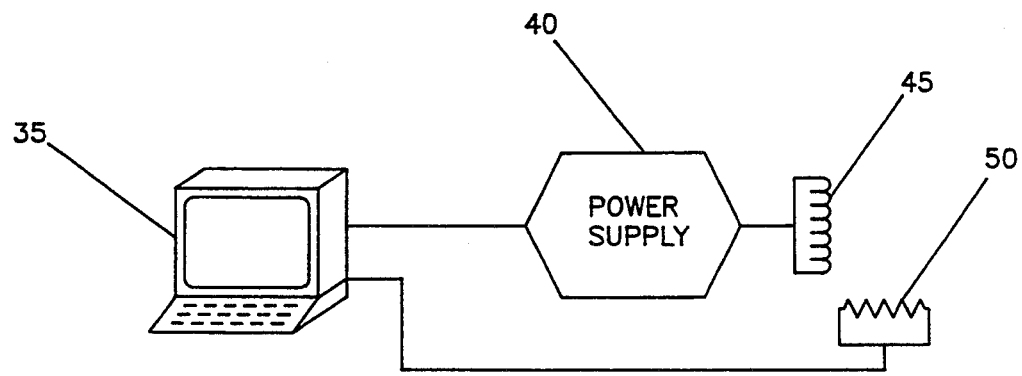
FIG. 3 depicts a more detailed view of the temperature control unit of FIG. 1.

Looking now to FIG. 3, a more detailed view is depicted of the source cell temperature control unit 25 of FIG. 1. The temperature control unit includes a computer 35 operatively connected to a power supply 40, a heating coil 45 which is powered by power supply 40 and a thermocouple 50 for monitoring actual source cell temperatures and feeding such information back to the computer 35. With reference now to both FIGS. 3 and 4, in order to ensure that the variation in individual layer instantaneous growth rates $G_i$ tends to stabilize about a substantially constant value over time, the programmed source cell temperature profile T (depicted in FIG. 4) generated by the computer 35 includes a series of graduated or ramped changes in temperature as a function of time. Such ramping also minimizes overshoots in temperatures generated by the heating element 45. The computer 35 conveys the programmed temperature profile to power supply 40 to control current (and hence temperature) to heating element 45. Thermocouple 50 can provide substantially instantaneous feedback of the measured source cell (not shown) temperature to the computer 35 and if actual temperatures are varying from the programmed temperature profile, the computer 35 can direct power supply 40 to adjust current flow to the heating element 45 accordingly.

The programmed source cell temperature profile is a generally periodic function varying between a maximum and minimum temperature. Since growth rates (i.e. the rate of deposition of a material onto a substrate) are closely related to source cell temperatures, the instantaneous growth rates similarly follow a periodic function varying from a maximum to a minimum. As used herein and understood by those skilled in the art, a growth cycle runs from minimum growth rate to minimum growth rate. In producing alternating layers of differing compositions requires the operation of at least two source cells with different materials. Consequently, the source cell programmed temperature profiles for each source cell will differ because of the different materials and moreover, the programmed source cell temperature profiles will generally be ~180° out of phase with one another.

EXAMPLE 1

Unlike typical MBE processes whereby a single growth cycle is used to deposit a single thin layer of material, the MBE process of the present invention can employ a plurality of shorter growth cycles to more reliably achieve the same layer thickness for a plurality of devices. For example, rather than conventionally deposit a 5000 Angstrom layer of material on a substrate with a single growth cycle, a plurality of thinner layers can be deposited one upon the other with a plurality of growth cycles so as to more accurately and reliably achieve the desired layer thickness. Moreover, no initial growth rate calibration or subsequent recalibration of growth rate is required, thus eliminating a severe limitation of existing controlled growth rate MBE processes.

Figure 4:
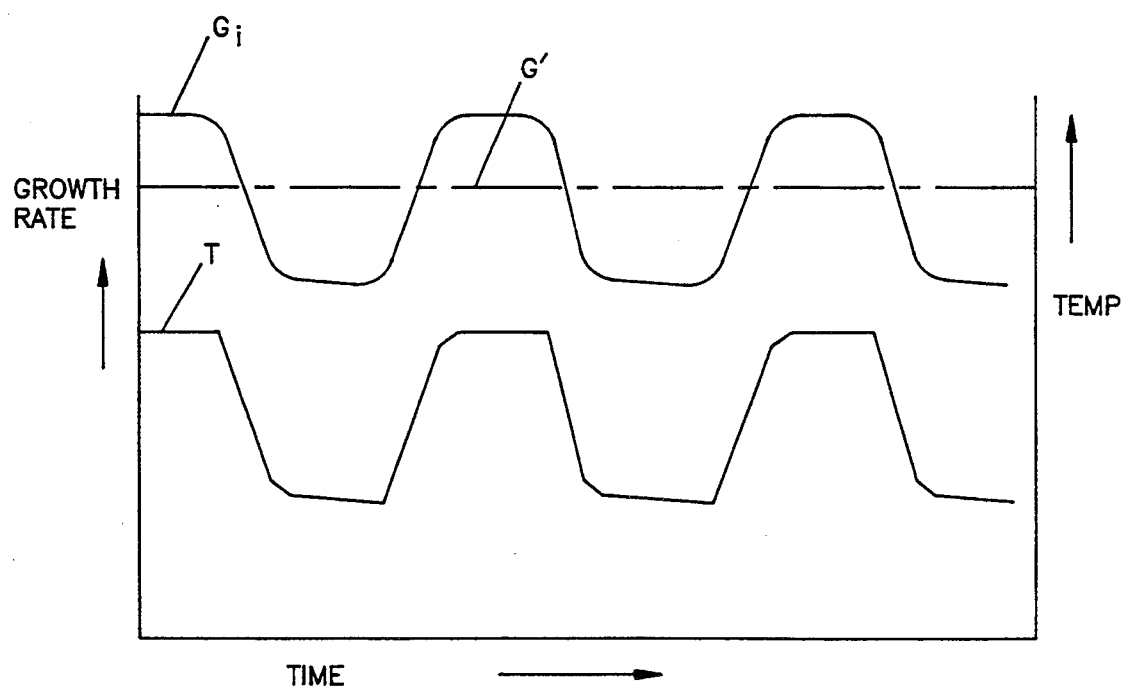
FIG. 4 depicts the programmed variation of source cell temperature T and instantaneous growth rates $G_i$ over the course of depositing a 5000 Angstrom layer of material.

In particular, such a single layer device can be produced with the present MBE process using a plurality of shorter growth cycles whereby programmed source cell temperatures T can be ramped up and down as depicted in FIG. 4. The result of varying source cell temperatures can yield instantaneous growth rates $G_i$ as depicted in FIG. 4; however, the average of the instantaneous growth rates $G'$ for each growth cycle and from one growth cycle to another remains substantially constant as a function of time. Moreover, such result can be obtained on the first device produced as well as on the last device produced several days or weeks later. Currently, depositing a 5000 Angstrom layer of material by conventional MBE processes can take ~30 min. depending on the material as well as other MBE operating parameters. During the course of such deposition, the initial, calibrated layer growth rate of the MBE system can change as a function of time by as much as 1-2% and by as much as 5-10% from one growth cycle to the next. As such, the ability to reliably and accurately produce a plurality of devices over an extended period of time having specified layer thicknesses within low tolerances (e.g. 5000 Angstroms ±1%) is severely limited.

The many unique properties of vertical-cavity surface-emitting lasers (VCSELs) have made them devices of great current interest. However, major obstacles to wider utilization of VCSELs in practical photonic systems have been their limited output power and poor efficiency, both of which are primarily due to dissipative losses in the highly resistive DBR mirrors. The high resistance arises from potential barriers formed at each λ/4 layer (e.g. AlAs/GaAs) heterointerface in the DBRs. The high effective mass of holes makes this problem especially acute in p-type DBR mirrors. Despite efforts to reduce the resistance by reducing the barriers, typical series resistance of DBR mirrors are still greater than 100 Ω for 10 μm diameter mesa devices, and continuous-wave power outputs of VCSELs are still in the 1-3 mW range. Additionally, for VCSELs to meet commercial expectations requires DBR mirrors to have center reflection wavelength within at least ±2% of each other.

Thus far, the most successful method of reducing heterojunction barriers grown by MBE process has been to linearly grade the DBR layer interfaces by forming a single, linearly graded alloy with rapid shutter sequencing at the λ/4 layer interfaces or by ramping source cell temperatures to vary growth rates. As used herein, a linearly graded alloy interface is one having a composition which varies linearly from the composition of one layer to the composition of the next layer. The single, linearly graded interface results in two smaller heterojunction barriers, but it still results in significant resistance. In principle, it should be possible to grow DBR mirrors that are virtually free of barriers through the use of continuously-graded interfaces such as sinusoids. Such continuous grading reduces compositions gradients and eliminates composition gradient discontinuities. Unfortunately, continuously-graded interfaces are difficult to grow and they are expected to suffer from significant growth rate uncertainties once the source cell temperatures have been changed, which in turn can lead to VCSELs with poor operating characteristics.

The present invention also provides a novel method for accurately and reliably producing DBRs. More particularly, source cell temperatures can be controlled so as to grow alternating layers for the DBR. Additionally by developing a more controlled source cell temperature ramping schema, more accurate and reproducible center reflection wavelengths can be achieved as well as reducing the resistance of the heterojunction between the alternating λ/4 layers of the DBR. It has generally believed that temperature ramping of the source cells could not be used to grow DBR's reliably because one source cell temperature changes the growth rate calibration is lost which would result in DBR layers which are not precisely λ/4 thick. While the present MBE system of ramping temperatures up and down can result in individual λ/4 layer thickness variations of ±3%, the reflectivity properties of such DBRs are virtually identical to those of conventionally grown DBRs; however, their center reflection wavelengths are more reproducible from device to device over extended periods of operation of MBE system.

Figure 5:
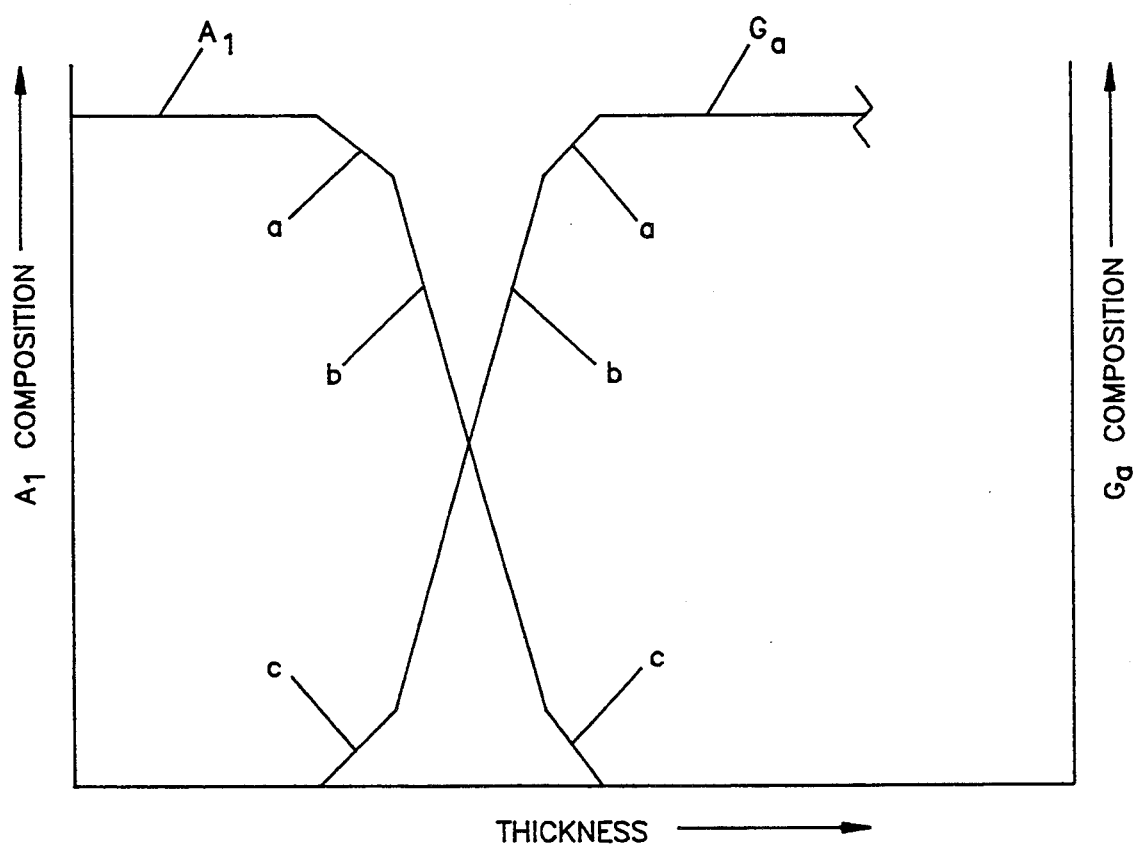
FIG. 5 depicts the compositional variation of adjacent $\lambda/4$ layers in a DBR.

The MBE method of the present invention will now be described in which growth of "piece wise-linearly-graded" DBR mirror interfaces can be formed that have greatly reduced series resistance's as well-as closely controlled reflectivity properties, both of which are extremely reproducible. The grading scheme approaches a continuous compositional grading by increasing the number of linearly graded segments at each interface from one to three (a, b, c) for AlAs and GaAs as seen in FIG. 5, thereby decreasing the size of the gradient discontinuities. This structure has lower heterojunction barriers than the single linear graded interfaces suggested by Hong.

EXAMPLE 2

Figure 6B:
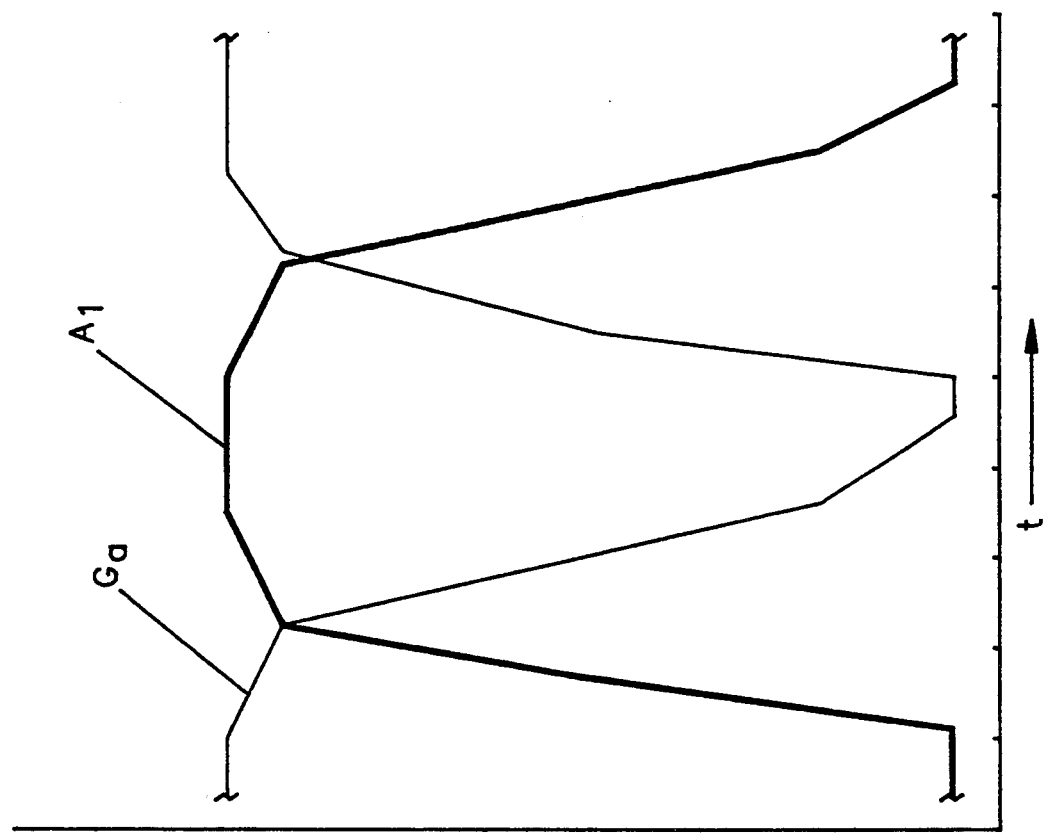
FIG. 6b depicts measured source cell temperature profile.
Figure 6A:
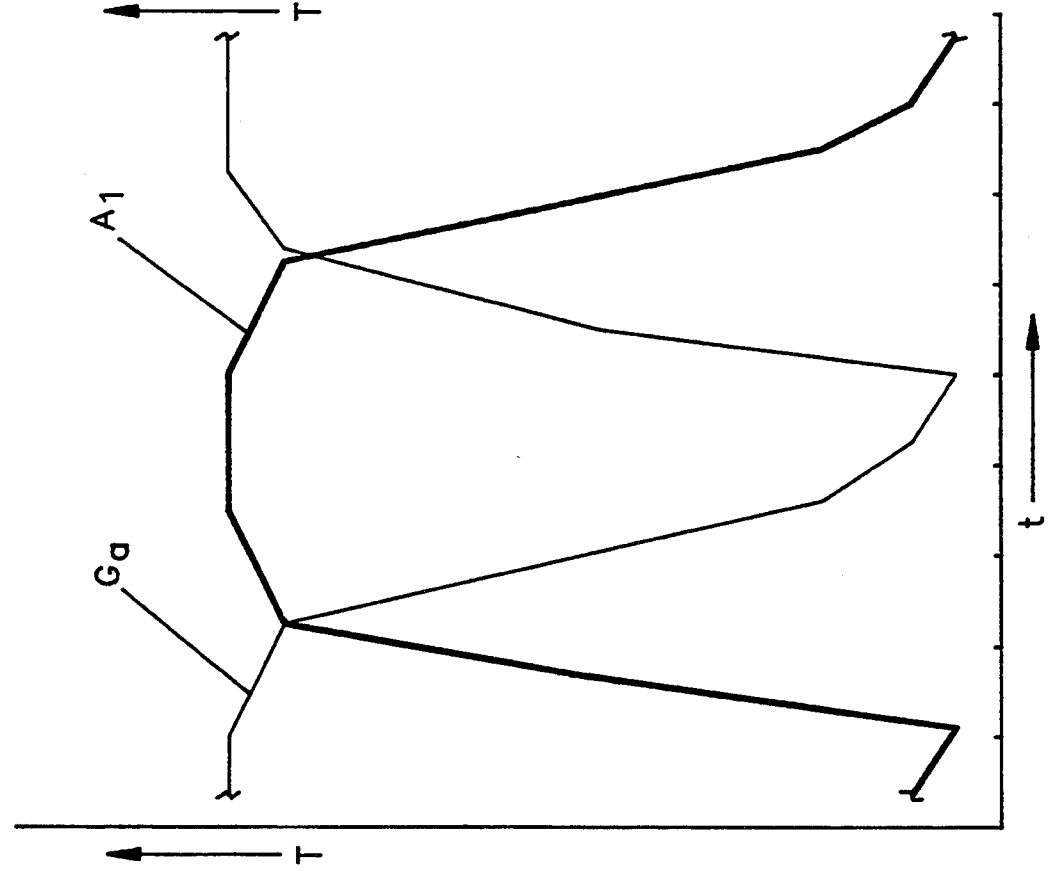
FIG. 6a depicts a programmed source cell temperature profile.

The DBR mirrors were manufactured by concurrently ramping the Al and Ga cell source temperatures as show in FIG. 6 to give AlAs, AlGaAs and GaAs layer composition profile seen in FIG. 5. In particular, FIG. 6a can represent the programmed temperature profiles for Al and Ga; whereas, FIG. 6b can represent the measured source cell temperature profiles of Al and Ga. Those skilled in the art will recognize that the source cell temperature profile for As, while not shown, will remain substantially constant. Temperature overshoot can be controlled by use of temperature ramps in the programmed temperature profiles and by use of the feedback from the thermocouple to the computer. An average growth rate of 3 Å/s was maintained and the substrate was held at 585° C. No initial growth rate calibrations were performed before any run nor between any growth cycle. Two dopant profiles were used: 1) a constant Be doping which resulted in hole concentrations in the highest Al-content layers that were only about 50% of those in the lowest Al-content layers, and 2) a variable Be doping designed to give a nearly constant hole concentration throughout the DBR mirror structure.

Table 1 lists data for seven different 20-period DBR mirrors produced according to the present invention. Electrically, the DBRs with three-segment interfaces are identical except for doping, which leads to their different resistivities. One can see that in contrast to the DBR with one-segment interface, the three-segment DBR mirror interfaces always exhibit barrier resistance that is less than their approximated bulk resistance. These results suggest that the three-segment grading scheme nearly eliminates heterojunction barriers. Table 1 also shows that the total resistivity of the DBR mirrors decreases as the carrier concentration increases. The minimum resistance obtainable is determined by the maximum carrier concentration, which is limited by excessive free-carrier absorption losses. The lowest value of 23 Ω for a 10 μm diameter mesa represents a large improvement over previous DBR mirror structures, and has resulted in devices with lasing threshold voltages under 1.5 V.

Figure 7:
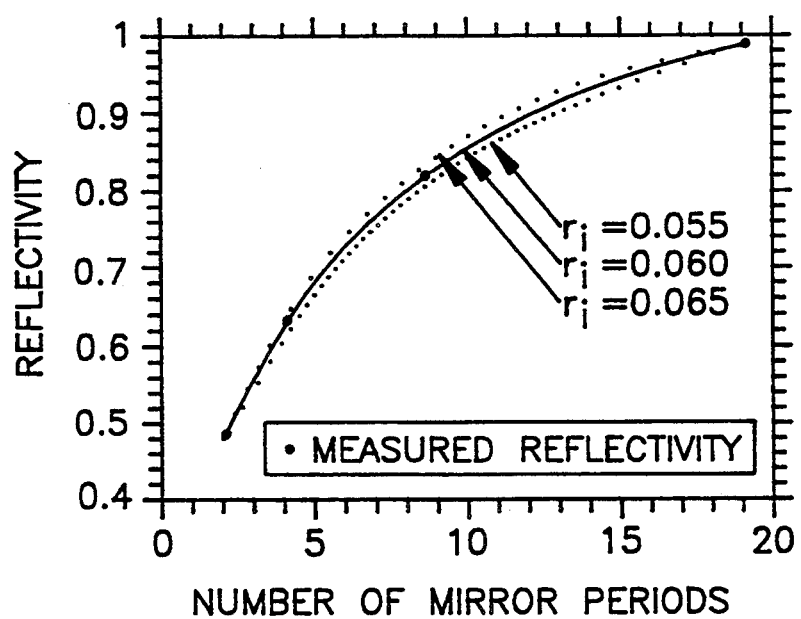
FIG. 7 depicts reflectivity as a function of period for a DBR.
Figure 8:
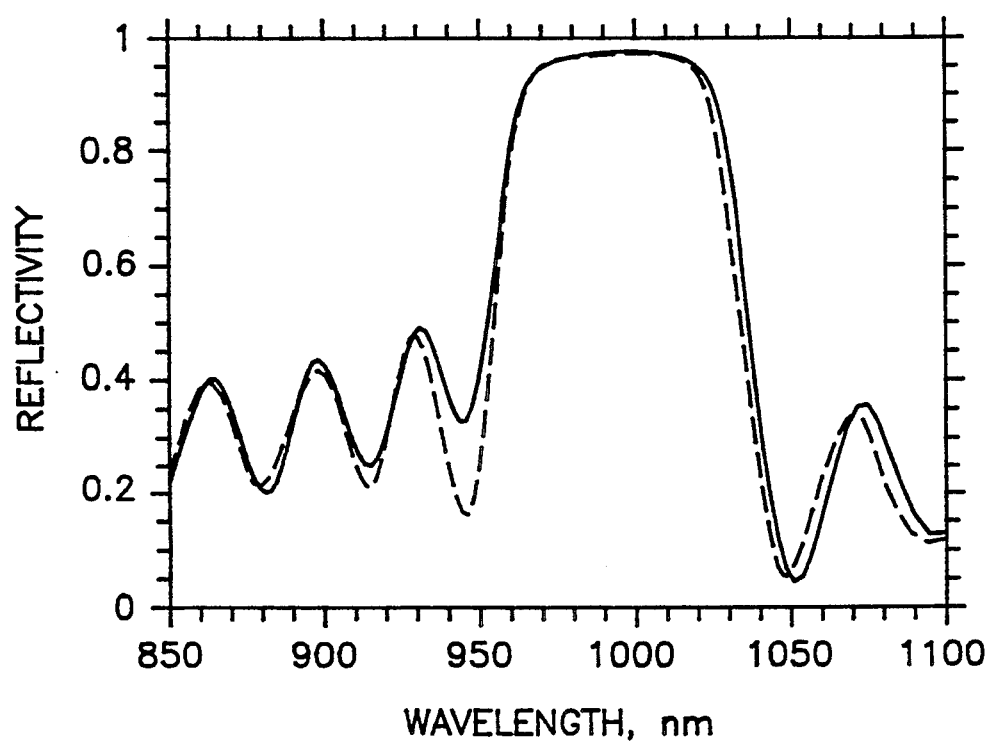
FIG. 8 depicts the center reflection wave length for a DBR.

These results show that three, piece wise-linearly-graded interfaces lead to lower DBR mirror interface resistances, but the center wavelength reflectivity of these mirror interfaces might be expected to be degraded compared to single-linear-grade mirror interfaces. In fact, the degradation is very slight and can be compensated for by an additional two or three mirror periods. FIG. 7 shows the measured peak reflectivity of a three-segment mirror interface as a function of the number of mirror periods, along with the theoretical reflectivity for different interfacial reflectivity ($r_i$) values, calculated using the than substitution technique. The measurements were made on a single sample by stopping growth, cooling the sample and measuring this reflectivity in situ, and then resuming growth to deposit additional periods for the next measurement. From FIG. 7, a reflectivity of $r_i = 0.060 \pm 0.002$ was measured for each three-segment mirror interface. This agrees well with coupled-mode theory calculations, which predict $r_i = 0.058$ for this structure, and is comparable to that of single-linear-grade interfaces, for which $r_i \approx 0.065$. The measured reflectivity spectra also agree well with transmission matrix simulations, as shown in FIG. 8.

These results also show that three, piece wise-linearly-graded interfaces in DBRs have good reflectivity characteristics. However, it has been commonly though that growths that involve source cell temperature variations could not result in DBR mirror center reflection wavelengths that are reproducible to within the 1–2% required for efficient VCSEL operation. Looking to Table 1, three groups of DBR mirrors were grown with slightly different source cell temperature ramping profiles. The two DBRs in Group 1 were grown using source cell temperature profiles which resulted in mirrors with a peak reflectivity wavelength near 9800 Å. Group 1's wavelengths were about 2% too long, but the two DBRs were within 10 Å of each other. For Group 2, the cell temperature profiles were modified to remove possible asymmetry in the DBR mirrors. This reduced the peak reflectivity wavelengths slightly, but again the two mirrors were only 2 Å apart, even though they were grown 12 days apart. Group 3's DBR layers were adjusted to bring them closer to the original target wavelength. Again, the DBR mirrors were remarkably close in wavelength, even though they were grown days apart.

The high degree of reproducibility reflected in Table 1 is due to the long-term stability of the average growth rates. Even though instantaneous growth rate reproducibility may not be better than a few percent each time source cell temperature is changed. The instantaneous growth rates tend to be centered about a single stable average growth rate. During DBR mirror growth, the source cell temperatures are ramped many times, leading to many different growth rates, and thus many different individual mirror layer thicknesses. But we have found that the reflectivity spectra of a DBR mirror stack with slightly differing stack thicknesses is virtually identical to a uniform-period mirror with the same average period.

In summary, (Al,Ga) As DBR mirrors having three, piece wise-linearly-graded interfaces grown by the MBE process of the present invention can have lower resistance and excellent reflectance and growth reproducibility characteristics. Incorporation of these DBR mirrors into VCSEL structures can lead to devices that have increased efficiency and output power.

TABLE 1

| Sample # | Linear segments per interface | Hole Concentration (cm$^{-3}$) | Measured resistivity (Ω cm$^2$) | Equivalen resistance of 10 μm dia. mesa | Bulk resistance of 10 μm dia. mesa | Barrier resistance of 10 μm dia. mesa | center wavelength | day in growth sequence |
|---|---|---|---|---|---|---|---|---|
| 1A | 3 | 1.5e18 | 4.7e-5 | 60Ω | 39Ω | 21Ω | 1001.1 nm | 1 |
| 1B | 3 | 1.3–2.4e18 | 3.6e-5 | 46Ω | 35Ω | 11Ω | 1000.2 nm | 1 |
| 2A | 1 | 2.0–3.7e18 | 7.1e-5 | 90Ω | 15Ω | 75Ω | N/A | 19 |
| 2B | 3 | 2.0–3.7e18 | 2.7e-5 | 34Ω | 24Ω | 10Ω | 994.3 nm | 19 |
| 2C | 3 | None | N/A | N/A | N/A | N/A | 994.5 nm | 31 |

TABLE 1-continued

| Sample # | Linear segments per interface | Hole Concentration (cm$^{-3}$) | Measured resistivity ($\Omega$ cm$^2$) | Equivalen resistance of 10 $\mu$m dia. mesa | Bulk resistance of 10 $\mu$m dia. mesa | Barrier resistance of 10 $\mu$m dia. mesa | center wavelength | day in growth sequence |
|---|---|---|---|---|---|---|---|---|
| 3A | 3 | 5e18 | 1.8e-5 | 23$\Omega$ | 15$\Omega$ | 8$\Omega$ | 984.4 nm | 33 |
| 3B | 3 | 4e18 | 2.1e-5 | 27$\Omega$ | 17$\Omega$ | 10$\Omega$ | 984.3 nm | 36 |

While the present invention has been described with respect to manufacture of (Al, Ga) As DBR mirrors, those skilled in the art will appreciate that the present method can be used in a wide variety of applications where reproducible control of layer thickness and variation of layer composition is needed. As such the present invention is to be limited only by the scope of the Claims attached herewith.

We claim:

1. A method of molecular beam epitaxial (MBE) deposition with a MBE system having at least one source cell, comprising the following steps:
  a) varying operating temperatures of each source cell between a first and second temperature so as to yield a plurality of different instantaneous growth rates in each growth cycle and at least two growth cycles for depositing a layer of material on a substrate; and
  b) controlling the temperature of each source cell such that the average of the different instantaneous growth rates remains substantially constant as a function of time for each growth cycle and from one growth cycle to the next.

2. The method of claim 1, further including controlling the number of growth cycles to achieve a layer thickness.

3. The method of claim 1, further including depositing a layer on the substrate having a varying composition of at least two materials.

4. The method of claim 1, further including, depositing at least two layers of alternating composition on the substrate employing at least two growth cycles.

5. The method of claim 4, further including controlling the temperature of each source cell so as to vary the composition of each layer.

6. The method of claim 4, further including varying the different instantaneous growth rate of each source cell so as to vary the composition of each layer.

7. The method of claim 4, further including forming an interlayer between each layer having a composition graduated from one layer to the next.

8. The method of claim 7, further including forming an interlayer between each layer composed of at least two, piece-wise linear compositions graduated from one layer to the next.

9. The method of claim 8, wherein the operating temperature of each source cell is varied so as to vary the composition of the interlayer.

10. A method for forming distributed Bragg reflectors (DBRs) with a molecular beam epitaxial (MBE) deposition system having at least two source cells, comprising the steps of:
  a) varying the operating temperature of a first source cell between a first temperature and a second temperature and generating a plurality of different instantaneous growth rates in each growth cycle for depositing a layer of a first material on a substrate;
  b) varying the operating temperature of a second source cell between a third temperature and a fourth temperature and generating a plurality of different instantaneous growth rates for depositing a layer of a second material on the first layer; and
  c) controlling the temperatures of each source cell such that the average of the different instantaneous growth rates for each source cell remains substantially constant as a function of time for each growth cycle and from one growth cycle to the next.

11. The method of claim 10, further including producing a plurality of alternating layers of first and second materials.

12. The method of claim 11 further including controlling the number of layers of first and second materials to achieve a thickness.

13. The method of claim 11 further including controlling the composition of the layers of first and second materials to achieve a DBR center reflection wavelength.

14. The method of claim 13, further including controlling the center reflection wavelength to within ±2% for a plurality of DBRs.

15. The method of claim 10, further including forming an interlayer between each layer of first and second materials having a composition linearly graduated from one layer to the next.

16. The method of claim 10, further including forming an interlayer between each layer of first and second materials having at least two piece-wise linearly graduated compositions.

17. The method of claim 10 wherein the temperatures of each source cell are ramped through a periodic profile so as to minimize overshoots in the measured temperature of each source cell.

18. The method of claim 17, wherein the temperature profiles for each source cell are approximately 180° out of phase.

19. A method for epitaxially depositing at least one layer of material on a substrate, comprising the following steps:
  a) varying the operating temperature of at least one source cell in a molecular beam epitaxial (MBE) deposition apparatus between a first and a second temperature during a growth cycle so as to yield a plurality of variations in growth rates of the layer of material deposited during the growth cycle; and
  b) controlling the temperature of the at least one source cell in the MBE deposition apparatus such that an average of the plurality of variations in growth rates remains substantially constant for each growth cycle and from one growth cycle to the next.

20. The method of claim 19, further including controlling the temperature of each source cell so as to vary the composition of each layer.

21. The method of claim 20, further including forming an interlayer between each layer composed of at least two, piece-wise linear compositions graduated from one layer to the next.

* * * * *